United States Patent
Niwa et al.

(10) Patent No.: US 10,980,101 B2
(45) Date of Patent: Apr. 13, 2021

(54) PLASMA GENERATING DEVICE

(71) Applicant: FUJI CORPORATION, Chiryu (JP)

(72) Inventors: Akihiro Niwa, Anjo (JP); Takahiro Jindo, Anjo (JP)

(73) Assignee: FUJI CORPORATION, Chiryu (JP)

( * ) Notice: Subject to any disclaimer, the term of this patent is extended or adjusted under 35 U.S.C. 154(b) by 376 days.

(21) Appl. No.: 15/578,295

(22) PCT Filed: Jun. 2, 2015

(86) PCT No.: PCT/JP2015/065907
§ 371 (c)(1),
(2) Date: Nov. 30, 2017

(87) PCT Pub. No.: WO2016/194138
PCT Pub. Date: Dec. 8, 2016

(65) Prior Publication Data
US 2018/0146537 A1    May 24, 2018

(51) Int. Cl.
*H05H 1/26* (2006.01)
*H05H 1/46* (2006.01)
(Continued)

(52) U.S. Cl.
CPC ............ *H05H 1/26* (2013.01); *C23C 16/513* (2013.01); *G03F 7/427* (2013.01);
(Continued)

(58) Field of Classification Search
CPC ....... B23K 10/00; C23C 16/513; G03F 7/427; H01J 2237/0213; H01J 37/32073;
(Continued)

(56) References Cited

U.S. PATENT DOCUMENTS 5,304,407 A * 4/1994 Hayashi ................ C23C 16/452
  427/255.5
5,393,952 A * 2/1995 Yamaguchi .............. H05H 1/34
  219/121.48

(Continued)

FOREIGN PATENT DOCUMENTS

JP    3-192697 A    8/1991
JP    2005-251719 A   9/2005
(Continued)

OTHER PUBLICATIONS

International Search Report dated Aug. 11, 2015 in PCT/JP2015/065907 filed Jun. 2, 2015.
(Continued)

*Primary Examiner* — Jeffrie R Lund
*Assistant Examiner* — Stanislav Antolin
(74) *Attorney, Agent, or Firm* — Oblon, McClelland, Maier & Neustadt, L.L.P.

(57) ABSTRACT

An atmospheric pressure plasma generating device includes a nozzle block in which fourth gas passages from which plasma gas is emitted are formed, is covered by cover, and a through-hole is formed in the cover such that the leading end of the fourth gas passage is positioned on the inside. Heated gas is supplied inside the cover and is emitted from the through-hole of the cover, and plasma gas is emitted so as to penetrate the heated gas. By the plasma gas being surrounded by the heated gas in this manner, deactivation of the plasma gas is prevented. A distance between the leading end of the fourth gas passage and an opening of the through-hole at an outer wall of the cover is set from 0 to 2 mm in an emission direction of the plasma gas.

6 Claims, 8 Drawing Sheets

(51) Int. Cl.
    *C23C 16/513*     (2006.01)
    *G03F 7/42*     (2006.01)
    *H01J 37/32*     (2006.01)
    *H01L 21/67*     (2006.01)
    *H05H 1/34*     (2006.01)

(52) U.S. Cl.
    CPC .... *H01J 37/3244* (2013.01); *H01J 37/32458* (2013.01); *H01J 37/32532* (2013.01); *H01J 37/32825* (2013.01); *H01L 21/67109* (2013.01); *H05H 1/46* (2013.01); *H05H 2001/3484* (2013.01); *H05H 2001/4675* (2013.01); *H05H 2240/10* (2013.01)

(58) Field of Classification Search
    CPC ........... H01J 37/32082; H01J 37/32091; H01J 37/321; H01J 37/3211; H01J 37/32321; H01J 37/32357; H01J 37/3244; H01J 37/32448; H01J 37/32458; H01J 37/32532; H01J 37/32825; H01L 21/67109; H05H 1/26; H05H 1/341; H05H 1/46; H05H 2001/3484; H05H 2001/4675; H05H 2240/10; H05H 2245/123
    See application file for complete search history.

(56) References Cited

U.S. PATENT DOCUMENTS

| | | | | | |
|---|---|---|---|---|---|
| 5,562,841 | A | * | 10/1996 | Kulik | C23C 4/12 219/121.47 |
| 5,578,130 | A | * | 11/1996 | Hayashi | C23C 16/452 118/719 |
| 5,869,832 | A | * | 2/1999 | Wang | H01J 49/26 250/288 |
| 6,056,824 | A | * | 5/2000 | Bartholomew | C23C 16/4401 118/715 |
| 6,800,336 | B1 | * | 10/2004 | Fornsel | C23C 8/36 118/723 E |
| 9,452,481 | B2 | * | 9/2016 | Hori | H05H 1/48 |
| 9,713,241 | B2 | * | 7/2017 | Hori | H05H 1/48 |
| 2001/0019042 | A1 | * | 9/2001 | Augeraud | B23K 10/00 219/121.59 |
| 2001/0025832 | A1 | * | 10/2001 | Nakamura | B23K 9/295 219/74 |
| 2003/0113479 | A1 | * | 6/2003 | Fukuda | H01J 37/32009 427/569 |
| 2004/0050685 | A1 | * | 3/2004 | Yara | C23C 16/4409 204/164 |
| 2005/0118350 | A1 | * | 6/2005 | Koulik | A61B 18/042 427/535 |
| 2007/0002515 | A1 | * | 1/2007 | Hino | H01J 37/32357 361/234 |
| 2007/0181540 | A1 | | 8/2007 | Lindsay | |
| 2008/0115892 | A1 | * | 5/2008 | Takeuchi | H01J 37/32348 156/345.29 |
| 2008/0173641 | A1 | * | 7/2008 | Hadidi | H05H 1/30 219/690 |
| 2008/0193342 | A1 | * | 8/2008 | Takeuchi | H01J 37/32348 422/186.04 |
| 2010/0028238 | A1 | * | 2/2010 | Maschwitz | H01J 37/32036 423/335 |
| 2010/0033096 | A1 | | 2/2010 | Choi et al. | |
| 2012/0058649 | A1 | * | 3/2012 | Okumura | H05H 1/28 438/798 |
| 2012/0190180 | A1 | * | 7/2012 | LoBue | H01L 21/02554 438/486 |
| 2012/0196050 | A1 | * | 8/2012 | Vermeer | C23C 16/45551 427/535 |
| 2012/0225218 | A1 | * | 9/2012 | Savas | C23C 16/45574 427/576 |
| 2013/0012029 | A1 | * | 1/2013 | Vermeer | C23C 16/0245 438/758 |
| 2013/0168361 | A1 | * | 7/2013 | Hori | H05H 1/48 219/69.11 |
| 2013/0174984 | A1 | * | 7/2013 | Hori | H05H 1/48 156/345.43 |
| 2013/0309416 | A1 | * | 11/2013 | Yokoyama | C23C 16/4412 427/569 |
| 2014/0030445 | A1 | * | 1/2014 | Vermeer | C23C 16/45551 427/569 |
| 2016/0329191 | A1 | * | 11/2016 | Sieber | H01J 37/32449 |
| 2016/0329192 | A1 | * | 11/2016 | Sieber | H05H 1/48 |

FOREIGN PATENT DOCUMENTS

| | | | | |
|---|---|---|---|---|
| JP | 2012-59548 A | | 3/2012 | |
| WO | WO-2012002478 A1 | * | 1/2012 | ............... H05H 1/24 |
| WO | WO-2012002479 A1 | * | 1/2012 | ............... B23H 1/00 |

OTHER PUBLICATIONS

Extended European Search Report dated Apr. 20, 2018 in European Patent Application No. 15894173.2, 9 pages.

* cited by examiner

PLASMA GENERATING DEVICE

TECHNICAL FIELD

The present invention relates to a plasma generating device that emits plasmarized gas from an emission port.

BACKGROUND ART

With a plasma generating device, by emitting plasmarized gas from an emission port towards a target body, plasma processing is performed on the target body. An example of a plasma generating device is disclosed in the patent literature below.
Patent Literature 1: JP-A-2012-059548

SUMMARY OF INVENTION

Technical Problem

According to the plasma generating device disclosed in the above patent literature, it is possible to perform plasma processing on a target body. However, when performing plasma processing using a plasma generating device, usually, plasma gas is emitted towards a target body loaded at a separated position a specified distance from the emission port. That is, during plasma processing, plasma gas is emitted into the air, and plasma gas emitted into the air is applied to the target body. In this case, plasma gas reacts with active gases in the air such as oxygen, and ozone is generated. This means that there is a problem of the plasma gas deactivating and appropriate plasma processing not being performed. Thus, one may consider emitting a protective gas for protecting the plasma gas along with the plasma gas, but there is a problem in that emitting a protective gas may obstruct the flow of plasma gas, meaning that plasma gas is not appropriately applied to the target body. The present invention takes account of such circumstances and an object thereof is to prevent deactivation of plasma gas while appropriately applying plasma gas to a target body.

Solution to Problem

To solve the above problems, a plasma generating device disclosed herein includes: a housing in which is formed a reaction chamber for plasmarizing processing gas; an emission port formed in the housing through which plasma gas plasmarized in the reaction chamber is emitted from the housing; a cover provided on the housing in a state covering at least the emission port; a gas supply device configured to supply heated gas heated inside the cover; and a through-hole formed in the cover such that an end of the emission port is positioned inside the through-hole; wherein a distance between the end of the emission port and an opening of the through-hole at an outer wall of the cover is 0 to 2 millimeters in an emitting direction of the plasma gas emitted from the emission port.

Also, to solve the above problems, a plasma generating device disclosed herein includes: a housing in which is formed a reaction chamber for plasmarizing processing gas; an emission port formed in the housing through which plasma gas plasmarized in the reaction chamber is emitted from the housing; a cover provided on the housing in a state covering at least the emission port; a gas supply device configured to supply heated gas heated inside the cover; and a through-hole formed in the cover such that an end of the emission port is positioned inside the through-hole.

Advantageous Effects

With a plasma generating device disclosed herein, an emission port from which plasma gas is emitted is covered by a cover, and a through-hole is formed in the cover such that an end of the emission port is positioned inside the through-hole. Also, heated gas is supplied inside the cover. By this, heated gas is emitted from the through-hole of the cover, and plasma gas is emitted from the emission port so as to penetrate the heated gas. That is, plasma gas is emitted to the air in a state surrounded by heated gas. Because ozone is broken down at high temperatures of 200 degrees Celsius and above, ozonization of the plasma gas covered by the heated gas is prevented. By this, deactivation of the plasma gas is prevented. Also, a distance between an end of the emission port and an opening of the through-hole at an outer wall of the cover is set from 0 to 2 mm in an emission direction of the plasma gas. By this, it is possible to appropriately cover plasma gas with heated gas without obstructing the flow of the plasma gas emitted from the emission port, thus plasma gas can be appropriately applied to a target body.

DESCRIPTION OF PREFERRED EMBODIMENTS

Figure 1:
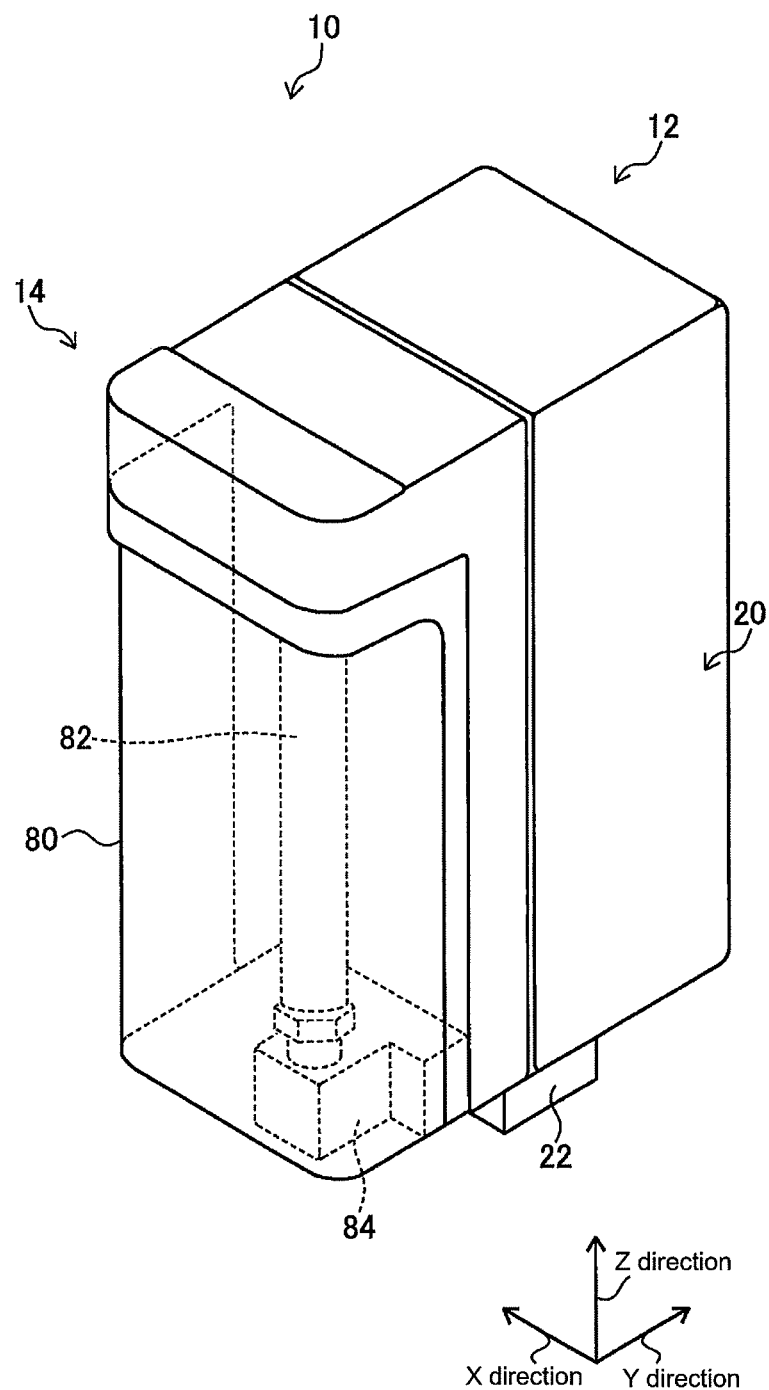
FIG. 1 is a perspective view of an atmospheric pressure plasma generating device.
Figure 2:
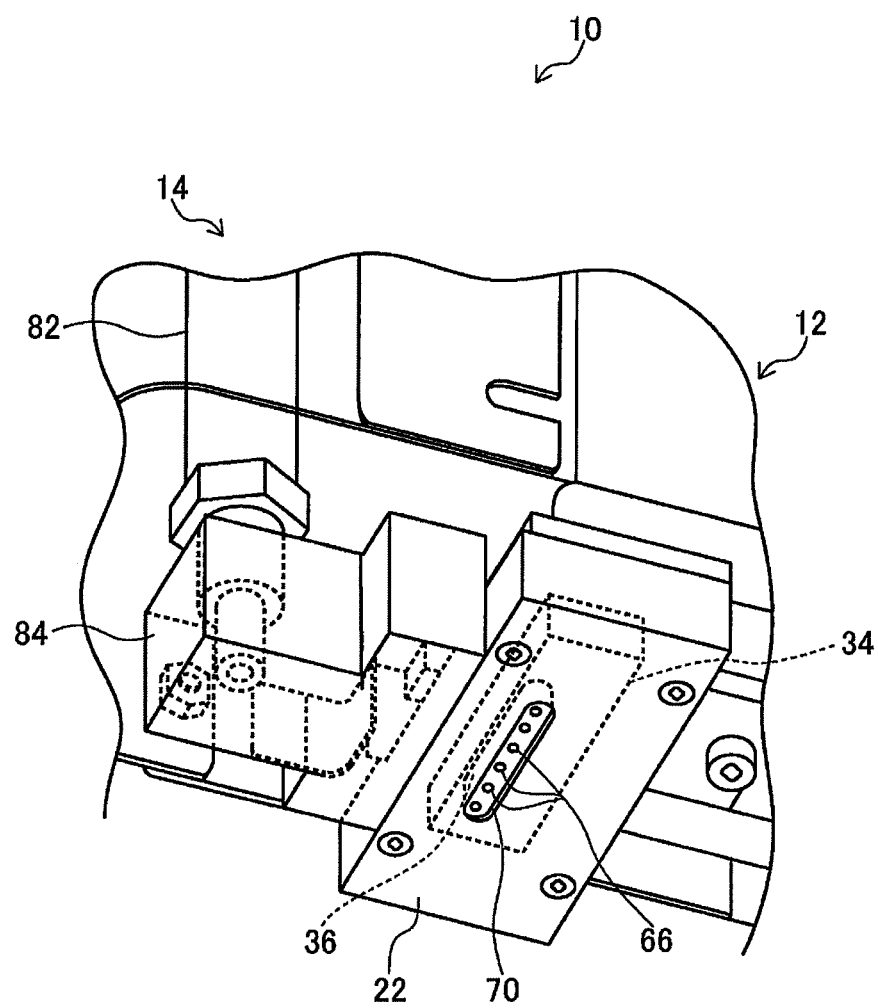
FIG. 2 is a perspective view of a lower end section of the atmospheric pressure plasma generating device.
Figure 2:
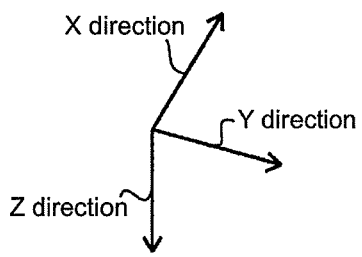
Figure 3:
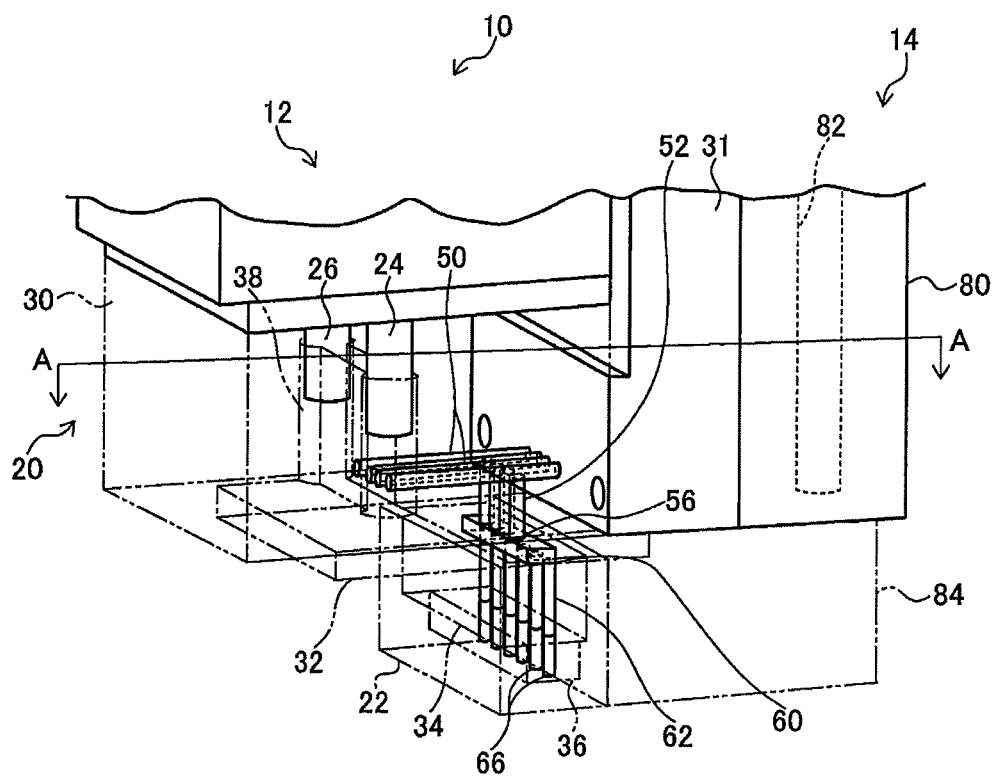
FIG. 3 is a perspective view of a lower end section of the atmospheric pressure plasma generating device.
Figure 3:
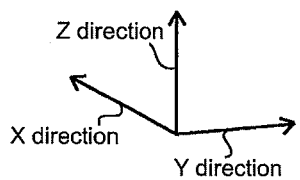
Figure 4:
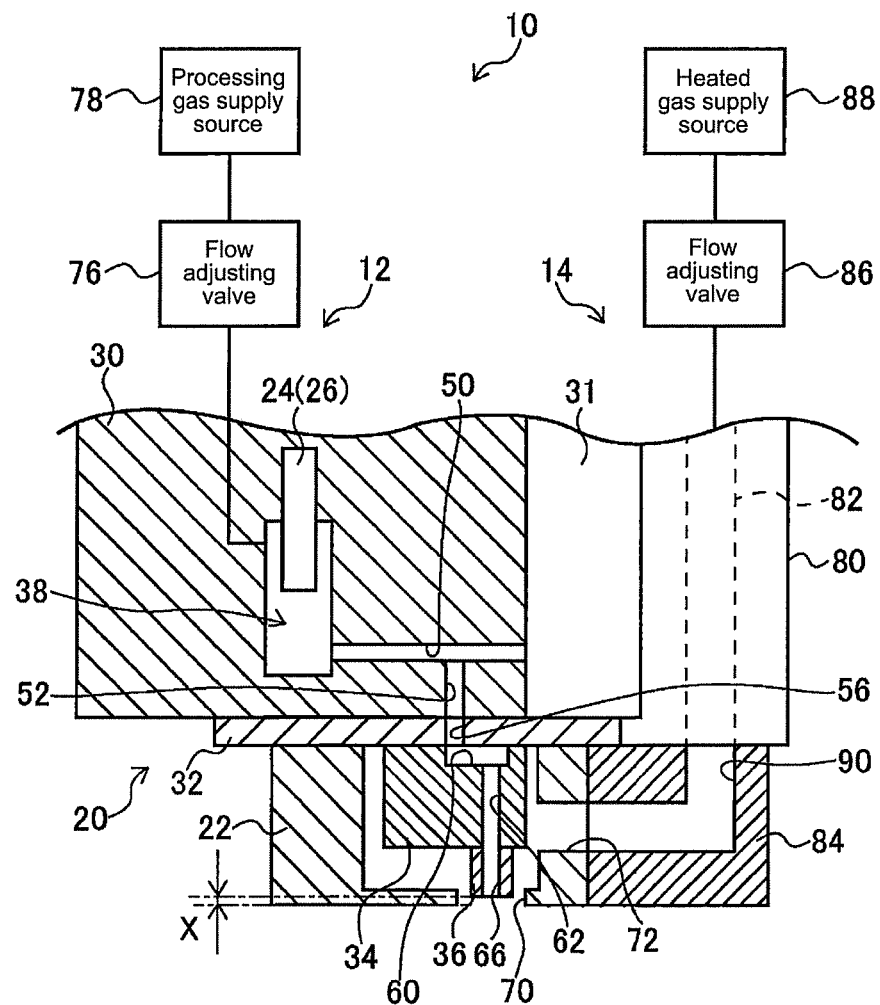
FIG. 4 is a cross section view at line A-A of FIG. 3.

The following describes in detail referring to the figures example embodiments of the present invention.
Configuration of Atmospheric Pressure Plasma Generating Device
FIGS. 1 to 4 show an embodiment of the present invention, atmospheric plasma generating device 10. Atmospheric pressure plasma generating device 10 is for generating plasma at atmospheric pressure, and is provided with plasma gas emitting device 12 and heated gas supply device 14. FIG. 1 is an overall perspective view of atmospheric plasma generating device 10 seen diagonally from above; FIG. 2 is a perspective view of a lower end section atmospheric plasma generating device 10 seen diagonally from below; FIG. 3 is a perspective view of a lower end section atmospheric plasma generating device 10 seen diagonally from above; and FIG. 4 is a cross section view at line A-A in FIG. 3. Further, a width direction of atmospheric plasma generating device 10 is an X direction, a lengthwise direction of atmospheric plasma generating device 10 is a Y direction, and a direction perpendicular to the X and Y directions, that is, a vertical direction, is a Z direction.

Plasma gas emitting device 12 is configured from housing 20, cover 22, and pair of electrodes 24 and 26. Housing 20 includes main housing 30, heat dissipation plate 31, earth plate 32, lower section housing 34, and nozzle block 36. Main housing 30 is roughly block-shaped, and reaction chamber 38 is formed inside main housing 30. Also, four first gas passages 50 are formed in main housing 30 extending in the Y direction, and these four first gas passages 50 are lined up in the X direction at specified intervals. An end section of each of the first gas passages 50 opens into reaction chamber 38, and the other end of first gas passages 50 opens at a side surface of main housing 30. Further, corresponding to the four first gas passages 50, four second gas passages 52 are formed in main housing 30 extending in the Z direction. The upper end sections of each of the second gas passages 52 open to the corresponding first gas passages 50, and the lower end sections of each of the second gas passages 52 open to the bottom surface of main housing 30.

Heat dissipation plate 31 is arranged on a side surface of main housing 30 at which the first gas passages 50 open, and covers the openings to the side surface of the first gas passages 50. Heat dissipation plate 31 includes multiple fins (not shown) that dissipate heat of main housing 30. Also, earth plate 32 functions as a grounding rod and is fixed to a lower surface of main housing 30. Four through-holes 56 are formed in earth plate 32 in a vertical direction corresponding to the four second gas passages 52, and each through-hole 56 is connected to a corresponding second gas passage 52.

Lower section housing 34 is block-shaped and is fixed to a lower surface of earth plate 32. Recess 60 is formed extending in the X direction in an upper surface of lower section housing 34, and recess 60 faces the four through-holes 56 of earth plate 32. Also, six third gas passages 62 are formed extending in the Z direction in lower section housing 34, and the six third gas passages 62 are lined up in the X direction at specified intervals. The upper end section of each third gas passage 62 opens to recess 60, and the lower end section of each third gas passage 62 opens to the bottom surface of lower section housing 34. Note that, each through-hole 56 of earth plate 32 faces in the Y direction an end section of recess 60 of lower section housing 34, and third gas passage 62 of lower section housing 34 opens at the other end of recess 60 in the Y direction.

Nozzle block 36 is fixed to a lower surface of lower section housing 34, and corresponding to the six third gas passages 62 of lower section housing 34, six fourth gas passages 66 are formed in the Z direction in nozzle block 36. The upper end section of each fourth gas passage 66 is connected to the corresponding third gas passage 62, and the lower end section of each fourth gas passage 66 opens at the lower surface of nozzle block 36.

Cover 22 is roughly square, and is arranged at the lower surface of earth plate 32 so as to cover lower section housing 34 and nozzle block 36. Through-hole 70 is formed in a lower surface of cover 22. Through-hole 70 is larger than the lower surface of nozzle block 36, and the lower surface of nozzle block 36 is positioned inside through-hole 70. Note that, the lower surface of nozzle block 36, that is, the lower end of the four gas passages 66 of nozzle block 36, do not protrude below through-hole 70 of cover 22; the lower end of the four gas passages 66 are positioned roughly at the same height as the lower surface of cover 22. Also, through-hole 72 is formed extending in the Y direction in a side surface of cover 22 towards heated gas supply device 14. Note that, through-hole 72 faces a side surface of lower section housing 34 positioned inside cover 22 and a surface area of a side surface of through-hole 72 is A cm$^2$. Also, a cross section area inside cover 22 in a direction perpendicular to through-hole 72, that is, perpendicular to the Y direction, is B cm$^2$.

Pair of electrodes 24 and 26 are arranged facing each other inside reaction chamber 38 of main housing 30. Processing gas supply source 78 is connected to reaction chamber 38 via flow adjusting valve 76. Processing gas supply source supplies processing gas that is a mixture at a given ratio of an active gas such as oxygen and an inert gas such as nitrogen. By this, a given flow amount (L/min) of processing gas is supplied to reaction chamber 38.

Also, heated gas supply device 14 includes protective cover 80, gas pipe 82, and connecting block 84. Protective cover 80 is arranged to cover heat dissipation plate 31 of plasma gas emitting device 12. Gas tube 82 is arranged inside protective cover 80 extending in the Z direction, and heated gas supply source 88 is connected to gas pipe 82 via flow adjusting valve 86. Heated gas supply source 88 heats an active gas such as oxygen or an inert gas such as nitrogen to a specified temperature and supplies the gas. By this, a given flow amount (L/min) of heated gas is supplied to gas pipe 82. Note that, a cross section area of gas pipe 82 in the diameter direction is C cm$^2$, and that cross section area C is smaller than cross section A of the side surface of lower section housing 34 and cross section B of the inside of cover 22.

Connecting block 84 is connected to the lower end of gas pipe 82, and is fixed to a side surface of cover 22 in the Y direction towards heated gas supply device 14. Connecting passage 90 that is roughly L-shaped is formed in connecting block 84, and one end section of connecting passage 90 opens at the upper surface of connecting block 84, and the other end section of connecting passage 90 opens at a side surface in the Y direction towards plasma gas emitting device 12. Also, an end section of connecting passage 90 is connected to gas pipe 82, and the other end section of connecting passage 90 is connected to through-hole 72 of cover 22.

Plasma processing by the atmospheric pressure plasma generating device With atmospheric pressure plasma generating device 10, in plasma gas emitting device 12, by the configuration described above, processing gas is plasmarized inside reaction chamber 38, and plasma gas is emitted from the lower end of the four gas passages 66 of nozzle block 36. Also, gas heated by heated gas supply device 14 is supplied inside cover 22. Then, plasma gas is emitted from through-hole 70 of cover 22 along with the heated gas such that plasma processing is performed on a target body. Plasma processing by atmospheric pressure plasma generating device 10 is described in detail below.

With plasma gas emitting device 12, processing gas is supplied to reaction chamber 38 by processing gas supply source 78, with the supply amount of the processing gas being adjusted by flow adjusting valve 76. The supply amount of processing gas is adjusted to a given level according to the type of plasma processing to be performed, the material of the target body, and so on, with a supply amount of 5 to 30 L/min being desirable, more specifically, a supply amount of 10 to 25 L/min being desirable.

Also, when processing gas is supplied to reaction chamber 38, in reaction chamber 38, voltage is applied to the pair of electrodes 24 and 26 such that current flows between the pair of electrodes 24 and 26. Thus, an electrical discharge occurs between the pair of electrodes 24 and 26, and the processing gas is plasmarized by the electrical discharge. Plasma gas generated in reaction chamber 38 flows in the Y direction inside first gas passage 50, and flows downwards inside second gas passage 52 and through-hole 56. Then, plasma gas flows in recess 60. Further, plasma gas flows in the Y direction inside recess 60, and flows downwards in third gas passage 62 and fourth gas passage 66. Thus, plasma gas is emitted from the lower end of fourth gas passage 66.

In this manner, with plasma gas emitting device 12, plasma gas generated in reaction chamber 38 is emitted from the lower end of fourth gas passage 66 via a crank-shaped passage. Therefore, light generated by the electrical discharge inside reaction chamber 38 is prevented from escaping from the lower end of fourth gas passage 66, and discharge from fourth gas passage 66 of material that has deteriorated due to the electrical discharge and the like is prevented, that is, foreign matter is prevented from being introduced to the target body.

Also, with heated gas supply device 14, gas is supplied to gas pipe 82 by heated gas supply source 88, with the supply amount of the heated gas being adjusted by flow adjusting valve 86. Then, heating is performed in gas pipe 82. The supply amount of heated gas is adjusted to a given level according to the type of plasma processing to be performed, the material of the target body, and so on, with a supply amount equal to or greater than the supply amount of processing gas in plasma gas emitting device 12 being desirable, more specifically, a flow amount of 1 to 2 times the supply amount of processing gas being desirable. To be even further specific, a supply amount of 1.3 to 1.7 times that of the processing gas is desirable. Also, the heated gas is heated to 600 to 800 degrees Celsius.

When heated gas is supplied from heated gas supply source 88 to gas pipe 82, heated gas enters cover 22 through through-hole 72 of cover 22 via connecting passage 90 of connecting block 84. Heated gas that has entered inside cover 22 is diffused by a side surface of lower section housing 34. Then, diffused heated gas inside cover 22 is emitted from through-hole 70 of cover 22. Here, plasma gas emitted from the lower end of fourth gas passage 66 of nozzle block 36 is protected by the heated gas. In detail, during plasma processing, plasma gas is applied towards a target body loaded at a position specified distance from the emission port of plasma gas of the atmospheric pressure plasma generating device. That is, during plasma processing, plasma gas is emitted into the air, and plasma gas emitted into the air is applied to the target body. In this case, plasma gas reacts with active gases in the air such as oxygen, and ozone is generated. This means that there is a problem of the plasma gas deactivating and appropriate plasma processing not being performed.

Figure 5:
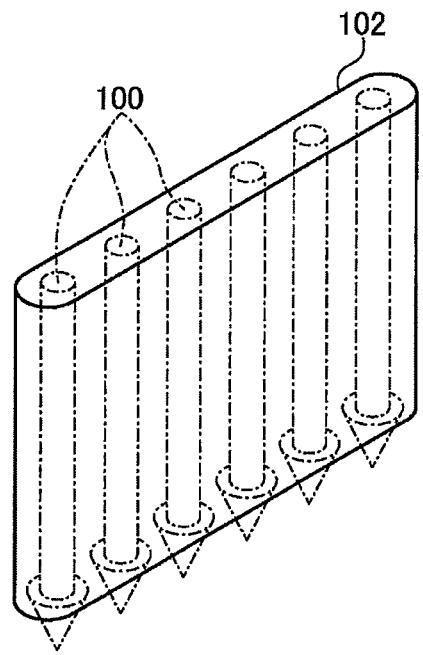
FIG. 5 is a schematic view of plasma gas in a state covered by heated gas.

Therefore, with atmospheric pressure plasma generating device 10, the lower end surface of nozzle block 36 from which plasma gas is emitted is arranged to be positioned inside through-hole 70 of cover 22, such that heated gas is supplied inside cover 22. By this, heated gas is emitted from through-hole 70 of cover 22, and plasma gas is emitted from the lower end of the six fourth gas passages 66 of nozzle block 36 so as to penetrate inside the heated gas. Here, as shown in FIG. 5, plasma gas 100 emitted from the lower end of the six fourth gas passages 66 of nozzle block 36 is covered by heated gas 102. Because the heated gas supplied to gas pipe 82 is 600 to 800 degrees Celsius, the heated gas emitted from through-hole 70 is at least 250 degrees Celsius. Because ozone is broken down at 200 degrees Celsius and above, ozonization of the plasma gas covered by the heated gas is prevented. This means that deactivating of the plasma gas is prevented and appropriate plasma processing can be performed.

Also, with atmospheric pressure plasma generating device 10, the position in the vertical direction of the lower end of fourth gas passages 66 is adjusted such that plasma gas emitted from fourth gas passages 66 in a state covered by heated gas emitted from through-hole 70 of cover 22 is applied appropriately towards the target body. In detail, in a case in which the emission port of fourth gas passages 66 from which plasma gas is emitted, that is, the opening to the lower end surface of nozzle block 36 of fourth gas passage 66 (hereinafter also referred to as "gas passage opening") protrudes below through-hole 70 of cover 22, that is, in a case in which the gas passage opening is positioned below the opening (hereinafter also referred to as "through-hole opening") to the lower surface of cover 22 of through-hole 70 in the processing gas emitting direction, that is, the Z direction, plasma gas emitted from fourth gas passages 66 is emitted into the air before being covered by heated gas, meaning there is a problem of the plasma gas deactivating.

On the other hand, in a case in which the gas passage opening is inside cover 22, that is, the gas passage opening is positioned higher in the Z direction to a certain extent than the through-hole opening, the flow of plasma gas emitted from fourth gas passage 66 is obstructed by the heated gas, meaning that there is a problem in that plasma gas is not appropriately applied to the target body.

Considering this, with atmospheric pressure plasma generating device 10, the gas passage opening is positioned at the same height in the Z direction as the through-hole opening, or positioned higher in the Z direction than the through-hole opening, with the distance in the Z direction between the gas passage opening and the through-hole opening being 2 mm or less. That is, the gas passage opening does not protrude from through-hole 70, with distance X (refer to FIG. 4) in the Z direction between the gas passage opening and the through-hole opening being 0 to 2 mm. By this, the plasma gas is appropriately covered by the heated gas without the flow of the plasma gas emitted from fourth gas passages 66 being obstructed. In particular, plasma gas emitted from fourth gas passages 66 flows directly and evenly towards the target body if the distance in the Z direction between the gas passage opening and the through-hole opening is 1 mm.

Figure 6:
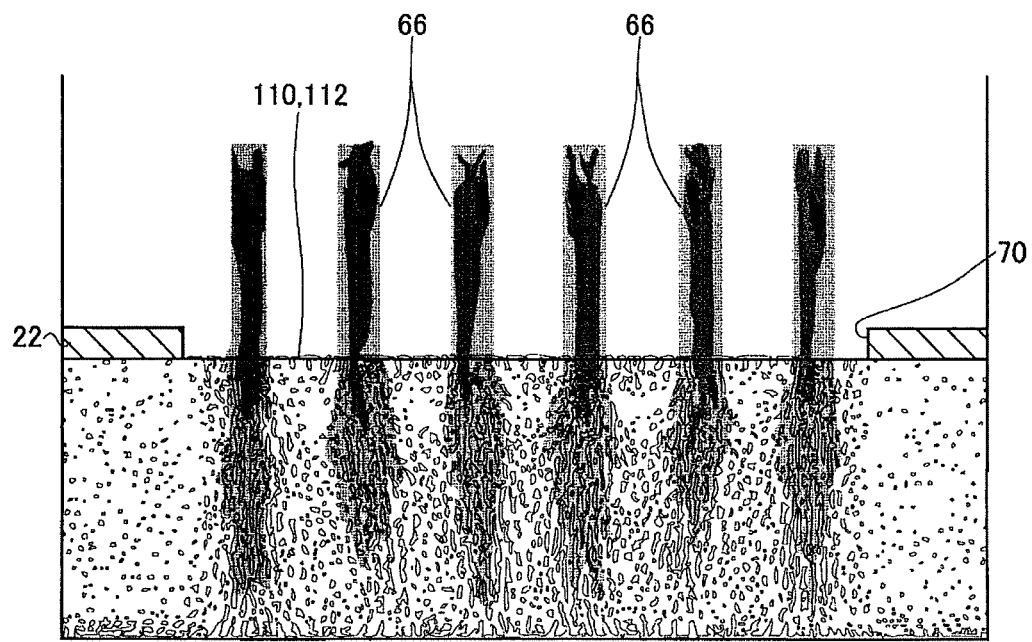
FIG. 6 is a schematic view showing flow of plasma gas in a case in which distance X in the Z direction between a gas passage opening and a through-hole opening is 0 mm.
Figure 7:
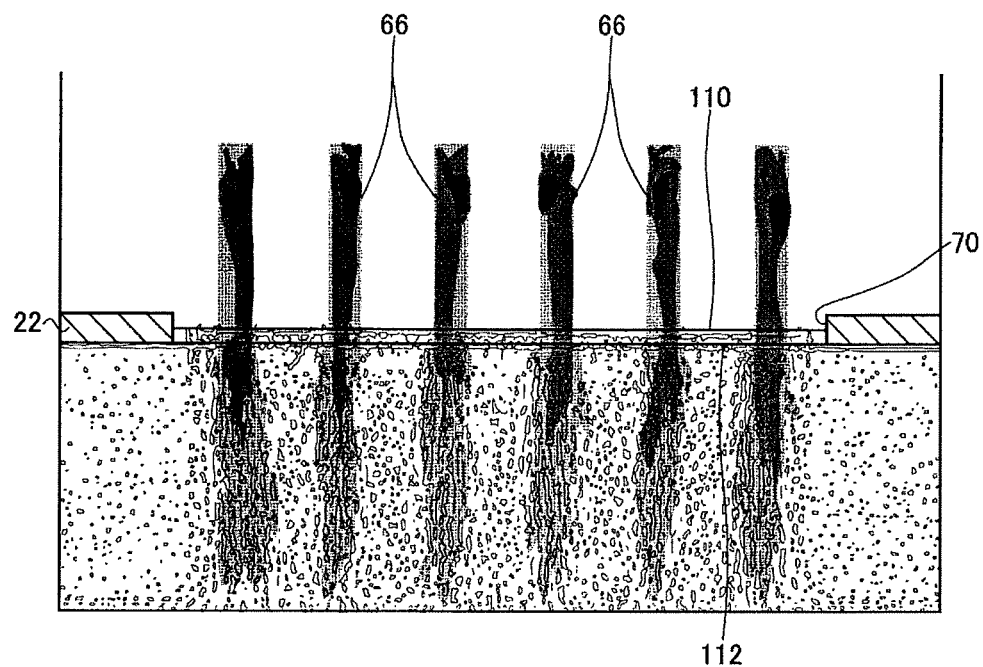
FIG. 7 is a schematic view showing flow of plasma gas in a case in which distance X in the Z direction between a gas passage opening and a through-hole opening is 0.5 mm.
Figure 8:
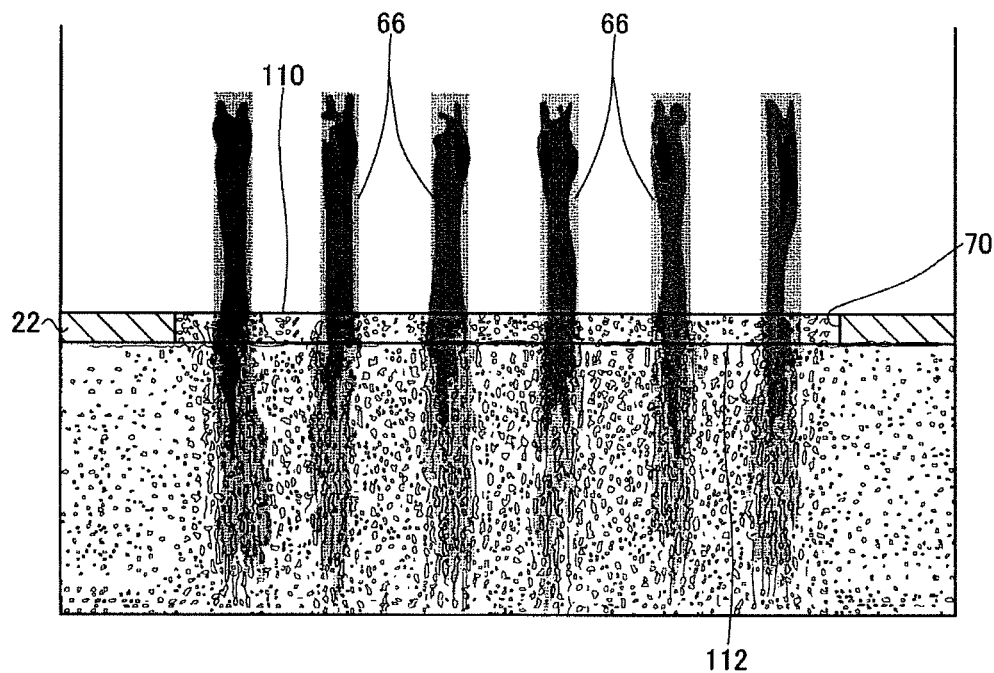
FIG. 8 is a schematic view showing flow of plasma gas in a case in which distance X in the Z direction between a gas passage opening and a through-hole opening is 1 mm.
Figure 9:
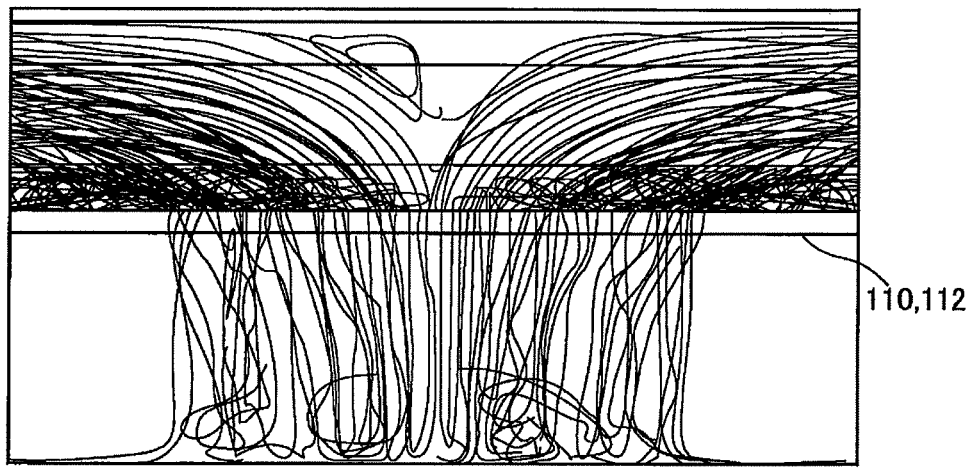
FIG. 9 is a schematic view showing flow of plasma gas in a case in which distance X in the Z direction between a gas passage opening and a through-hole opening is 0 mm.
Figure 10:
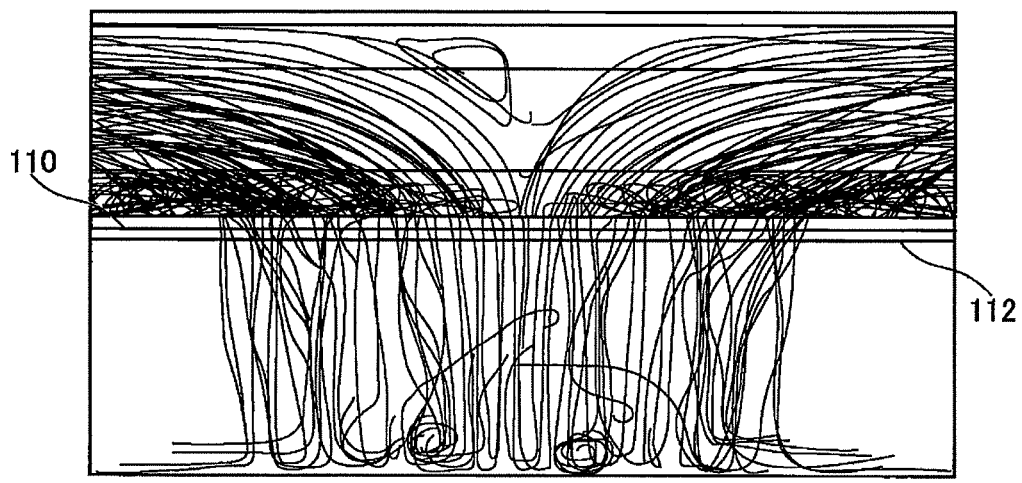
FIG. 10 is a schematic view showing flow of plasma gas in a case in which distance X in the Z direction between a gas passage opening and a through-hole opening is 0.5 mm.
Figure 11:
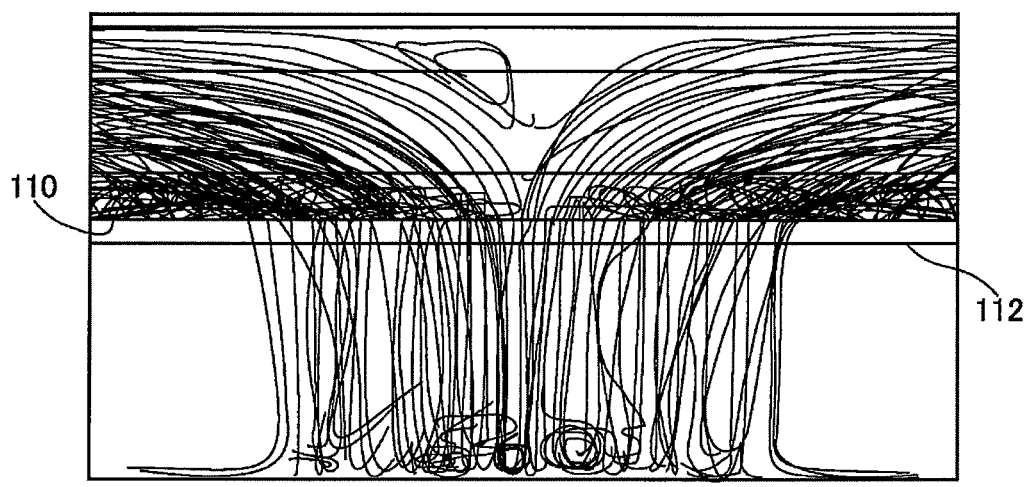
FIG. 11 is a schematic view showing flow of plasma gas in a case in which distance X in the Z direction between a gas passage opening and a through-hole opening is 1 mm.

Specifically, the flow of processing gas when processing gas is emitted from the lower end of fourth gas passages 66 in a state with heated gas emitted from through-hole 70 of cover 22 is shown in FIGS. 6 to 11 and is described below with reference to FIGS. 6 to 11. FIGS. 6 to 8 show a punctiform view of plasma gas emitted from fourth gas passages 66; FIGS. 9 to 11 show a line form view of processing gas emitted from fourth gas passages 66. FIGS. 6 and 9 show the flow of processing gas in a case in which distance X in the Z direction between the gas passage opening and the through-hole opening is 0 mm; FIGS. 7 and 10 show the flow of processing gas in a case in which distance X in the Z direction between the gas passage opening and the through-hole opening is 0.5 mm; FIGS. 8 and 11 show the flow of processing gas in a case in which distance X in the Z direction between the gas passage opening and the through-hole opening is 1 mm. Note that, to clarify the position in the Z direction of the gas passage opening and the position in the Z direction of the through-hole opening, the position in the Z direction of the gas passage opening is shown by line 110, and the position in the Z direction of the through-hole opening is shown by line 112.

As can be seen by comparing FIGS. 6 to 8, processing gas in FIG. 8 is shown in a dense state even at a location somewhat distant from fourth gas passages 66; however, processing gas in FIG. 6 is shown in a diffused state at a location somewhat distant from fourth gas passages 66. Processing gas in FIG. 7 is shown in an intermediate state of the processing gas shown in FIG. 6 and the processing gas shown in FIG. 8. Also, as can be seen by comparing FIGS. 9 to 11, processing gas in FIG. 11 is shown overall as straight lines; however, processing gas in FIG. 9 is shown in a state curved at both end sections. Processing gas in FIG. 10 is shown in an intermediate state of the processing gas shown in FIG. 9 and the processing gas shown in FIG. 11. That is, by having a distance of 1 mm in the Z direction between the gas passage opening and the through-hole opening, the flow of processing gas emitted from fourth gas passages 66 is even and in a straight line. In this manner, with atmospheric pressure plasma generating device 10, by having a distance of 1 mm in the Z direction between the gas passage opening and the through-hole opening, it is possible to apply processing gas emitted from fourth gas passages 66 directly towards a target body, and to evenly apply the processing gas to the target body.

Further, with atmospheric pressure plasma generating device 10, heated gas flows through gas pipe 82 with a cross section area C and enters inside a cover with a cross section B (B> C). By this, it is possible to slow the entry speed of the heated gas, such that heated gas can be supplied inside cover 22 without obstructing the flow of the plasma gas emitted form fourth gas passages 66. Further, lower section housing 34 is arranged at a position facing through-hole 72 for supplying heated gas inside cover 22, with the surface area A of the side surface of lower section housing 34 facing through-hole 72 being larger than cross section area C of gas pipe 82. Therefore, heated gas that has entered inside cover 22 is effectively diffused by the side surface of lower section housing 34. By this, heated gas can be supplied inside cover 22 without obstructing the flow of plasma gas emitted from fourth gas passage 66. Further, the emission ports of fourth gas passages 66 from which plasma gas is emitted are arranged so as not to be positioned between through-hole 72 of cover 22 and lower section housing 34. By this, it is possible to supply heated gas inside cover 22 without obstructing the flow of plasma gas.

Also, with atmospheric pressure plasma generating device 10, heated gas of at least 200 degrees Celsius is emitted towards the target body along with plasma gas, therefore the target body is heated by the processing gas, and plasma processing is performed on the heated target body. Thus, the reactivity of the target body is increased, meaning that plasma processing can be performed effectively. Note that, in order to perform plasma processing effectively by heating the target body, it is preferable for heated gas supplying device 14 to supply heated gas of a temperature such that the surface temperature of the target body reaches 250 degrees C. or higher. Specifically, it is desirable to supply heated gas of 600 to 800 degrees Celsius from heated gas supply source 88. Note that, in a case in which the heated gas is an inert gas, compared to a case in which the heated gas is an active gas, because the surface temperature of the target body is lower, it is desirable to set the temperature of the heated gas in accordance with the type of the heated gas. Specifically, for example, in a case in which an inert gas heated to 700 degrees Celsius is supplied by heated gas supply source 88, the surface temperature of the target body becomes 250±10 degrees Celsius. On the other hand, in a case in which an active gas heated to 700 degrees Celsius is supplied by heated gas supply source 88, the surface temperature of the target body becomes 280±10 degrees Celsius. In this manner, even for a case in which heated gas of the same temperature is supplied by heated gas supply source 88, the surface temperature of the target body when the heated gas is an inert gas is lower than the surface temperature of the target body when the heated gas is an active gas. Therefore, it is desirable to set the temperature of the heated gas considering such a temperature difference.

Note that, in an embodiment above, atmospheric pressure plasma generating device 10 is an example of a plasma generating device. Heated gas supply device 14 is an example of a gas supply device. Housing 20 is an example of a housing. Cover 22 is an example of a cover. A side surface of lower section housing 34 is an example of a diffusion wall. Reaction chamber 38 is an example of a reaction chamber. First gas passage 50, second gas passage 52, through-hole 56, recess section 60, third gas passage 62, and fourth gas passage 66 are examples of a gas passage. Through-hole 70 is an example of a through-hole. Through-hole 72 is an example of a supply hole. Gas pipe 82 is example of a supply tube. The gas passage opening is an example of an emission port.

Further, the present invention is not limited to the above example embodiments, and various changed or improved methods of embodiment are possible based on the knowledge of someone skilled in the art. Specifically, for example, in an embodiment above, the present invention is applied to atmospheric pressure generating device 10 that generates plasma due to the electrical discharge generated between one pair of electrodes, however, the present invention may be applied to a plasma generating device that generates plasma by electrical discharge that occurs along the side walls of reaction chamber 38.

REFERENCE SIGNS LIST

10: atmospheric pressure plasma generating device (plasma generating device); 14: heated gas supply device (gas supply device); 20: housing; 22: cover; 34: lower section housing (diffusion wall); 38: reaction chamber; 50: first gas passage (gas passage); 52: second gas passage (gas passage); 56: through-hole (gas passage); 60: recess section (gas passage); 62: third gas passage (gas passage); 66: fourth gas passage (gas passage); 70: through-hole; 72: through-hole (supply hole); 82: gas pipe (supply tube)

The invention claimed is:

1. A plasma generating device comprising:
   a housing in which is formed a reaction chamber for plasmarizing processing gas;
   multiple emission ports formed in the housing through which plasma gas plasmarized in the reaction chamber is emitted from the housing;
   a lower section housing where multiple gas passages are formed and respectively connected with the emission ports extending in an emitting direction of the plasma gas emitted from the emission ports, the gas passages being lined up in a direction perpendicular to the emitting direction at specified intervals;

a cover provided on the housing in a state covering at least the emission ports;

a gas supply device configured to supply heated gas heated inside the cover; and a through-hole formed in a lower surface of the cover such that ends of the emission ports are positioned inside the through-hole, wherein the heated gas supplied from the gas supply device that enters inside the cover is diffused and the diffused heated gas inside the cover is emitted through the through-hole, wherein the ends of the emission ports are provided in a lower end surface of a nozzle block arranged to be positioned inside the through-hole such that the plasma gas emitted from the ends of the emission ports penetrates inside the diffused heated gas emitted through the through-hole, wherein a distance between the ends of the emission ports and an opening of the through-hole at an outer wall of the cover is 0 to 2 millimeters in the emitting direction of the plasma gas emitted from the emission ports, wherein the gas supply device includes a supply tube for supplying heated gas, wherein a cross section area of an internal section of the cover in a direction perpendicular to a supply direction of the heated gas supplied inside the cover is larger than a cross section area of the supply tube in a diameter direction, wherein the lower section housing diffuses the heated gas supplied inside the cover, the lower section housing being arranged inside the cover facing a supply hole for supplying the heated gas inside the cover, and wherein a surface area of a surface along which the gas passages are lined up of the lower section housing facing the supply hole is larger than the cross section area of the supply tube in the diameter direction.

2. The plasma generating device according to claim 1, wherein the gas passages are formed connecting the reaction chamber and the emission port, the gas passages being bent in a crank shape.

3. The plasma generating device according to claim 2, wherein the nozzle block is fixed to a lower surface of the lower section housing, the lower section housing is block-shaped and is fixed to a lower surface of an earth plate, a recess is formed extending in a width direction of the plasma generating device in an upper surface of the lower section housing, and the recess faces four through-holes of the earth plate.

4. The plasma generating device according to claim 2, wherein the plasma gas is emitted from a lower end of the gas passages of the nozzle block, an earth plate is fixed to a lower surface of a main housing, the earth plate functions as a grounding rod, four through-holes are formed in the earth plate in a vertical direction corresponding to four of the gas passages, and each through-hole is connected to a corresponding gas passage.

5. The plasma generating device according to claim 1, wherein the emission ports are arranged at a location except between the supply hole and the lower section housing.

6. A plasma generating device comprising:

a housing in which is formed a reaction chamber for plasmarizing processing gas;

multiple emission ports formed in the housing through which plasma gas plasmarized in the reaction chamber is emitted from the housing;

a lower section housing where multiple gas passages are formed and respectively connected with the emission ports extending in an emitting direction of the plasma gas emitted from the emission ports, the gas passages being lined up in a direction perpendicular to the emitting direction at specified intervals;

a cover provided on the housing in a state covering at least the emission ports;

a gas supply device configured to supply heated gas heated inside the cover; and a through-hole formed in a lower surface of the cover such that ends of the emission ports are positioned inside the through-hole, wherein the heated gas supplied from the gas supply device that enters inside the cover is diffused and the diffused heated gas inside the cover is emitted through the through-hole, and wherein the ends of the emission ports are provided in a lower end surface of a nozzle block arranged to be positioned inside the through-hole such that the plasma gas emitted from the ends of the emission ports penetrates inside the diffused heated gas emitted through the through-hole, wherein the gas supply device includes a supply tube for supplying heated gas, wherein a cross section area of an internal section of the cover in a direction perpendicular to a supply direction of the heated gas supplied inside the cover is larger than a cross section area of the supply tube in a diameter direction, wherein the lower section housing diffuses the heated gas supplied inside the cover, the lower section housing being arranged inside the cover facing a supply hole for supplying the heated gas inside the cover, and wherein a surface area of a surface along which the gas passages are lined up of the lower section housing facing the supply hole is larger than the cross section area of the supply tube in the diameter direction.

* * * * *